United States Patent
Nishimura et al.

(10) Patent No.: US 11,592,025 B2
(45) Date of Patent: Feb. 28, 2023

(54) DRY PUMP AND EXHAUST GAS TREATMENT METHOD

(71) Applicant: Edwards Japan Limited, Yachiyo (JP)

(72) Inventors: Katsumi Nishimura, Yachiyo (JP); Katsunori Takahashi, Yachiyo (JP)

(73) Assignee: Edwards Japan Limited, Chiba (JP)

( * ) Notice: Subject to any disclaimer, the term of this patent is extended or adjusted under 35 U.S.C. 154(b) by 264 days.

(21) Appl. No.: 15/328,306

(22) PCT Filed: Jul. 6, 2015

(86) PCT No.: PCT/JP2015/069429
§ 371 (c)(1),
(2) Date: Jan. 23, 2017

(87) PCT Pub. No.: WO2016/017376
PCT Pub. Date: Feb. 4, 2016

(65) Prior Publication Data
US 2017/0204860 A1 Jul. 20, 2017

(30) Foreign Application Priority Data
Jul. 31, 2014 (JP) .............................. JP2014-157053

(51) Int. Cl.
*F04C 29/04* (2006.01)
*H01L 21/205* (2006.01)
(Continued)

(52) U.S. Cl.
CPC .............. *F04C 29/04* (2013.01); *F04B 37/16* (2013.01); *F04C 18/126* (2013.01); *F04C 25/02* (2013.01);
(Continued)

(58) Field of Classification Search
None
See application file for complete search history.

(56) References Cited

U.S. PATENT DOCUMENTS 3,598,208 A * 8/1971 Bronder .................... G01L 3/20
188/290
3,975,914 A * 8/1976 Tufts .................... F01K 25/106
60/673
(Continued)

FOREIGN PATENT DOCUMENTS

EP 2662881 A2 11/2013
GB 2442738 A 4/2008
(Continued)

OTHER PUBLICATIONS

European Communication dated Jan. 4, 2018 and Supplementary European Search Report dated Dec. 14, 2017 for corresponding European Application No. EP15827048.8.
(Continued)

*Primary Examiner* — Christopher P Jones
*Assistant Examiner* — Phillip Y Shao
(74) *Attorney, Agent, or Firm* — Theodore M. Magee; Westman, Champlin & Koehler, P.A.

(57) ABSTRACT

An object of the present invention is to provide a dry pump and an exhaust gas treatment method which can improve an effect of inhibiting a reaction product from adhering to the inside of a gas outlet port of the dry pump, a gas exhaust pipe, or the like and can also improve an energy saving effect. To attain the object, the present invention includes the gas exhaust pipe disposed to be connected to the gas outlet port of the dry pump and to a gas inlet port of a detoxification device, and a heat exchanger which heats a diluent gas introduced therein using a heat generated from the dry pump and introduces the heated diluent gas into the gas exhaust pipe to heat a used gas to a temperature of not less than a predetermined value.

7 Claims, 6 Drawing Sheets (51) Int. Cl.
    *F04B 37/16*     (2006.01)
    *H01L 21/3065*   (2006.01)
    *F04D 19/04*     (2006.01)
    *F04C 25/02*     (2006.01)
    *F04C 18/12*     (2006.01)
    *F04C 29/12*     (2006.01)
    *F28D 7/00*      (2006.01)
    *F28D 7/16*      (2006.01)
    *H01L 21/67*     (2006.01)

(52) U.S. Cl.
    CPC .............. *F04C 29/12* (2013.01); *F04D 19/04* (2013.01); *F28D 7/0008* (2013.01); *F28D 7/1653* (2013.01); *H01L 21/205* (2013.01); *H01L 21/3065* (2013.01); *H01L 21/67017* (2013.01); *F04C 2210/225* (2013.01)

(56) References Cited

U.S. PATENT DOCUMENTS

| | | | | |
|---|---|---|---|---|
| 4,454,935 A * | 6/1984 | Pryor | ................... | F16D 57/005 |
| | | | | 415/58.1 |
| 5,442,923 A * | 8/1995 | Bareiss | .................. | F04C 29/12 |
| | | | | 60/520 |
| 5,846,062 A * | 12/1998 | Yanagisawa | ............ | F04C 18/16 |
| | | | | 417/410.4 |
| 6,241,490 B1 * | 6/2001 | Rippl | .................. | F04C 27/009 |
| | | | | 417/410.4 |
| 6,428,284 B1 * | 8/2002 | Vaisman | ............... | F25B 49/022 |
| | | | | 417/310 |
| 2002/0131870 A1 * | 9/2002 | Puech | .................. | F04B 37/14 |
| | | | | 417/205 |
| 2005/0118013 A1 * | 6/2005 | Downham | .......... | F04D 27/0215 |
| | | | | 415/55.1 |
| 2005/0123414 A1 | 6/2005 | Key et al. | | |
| 2005/0142010 A1 * | 6/2005 | Bailey | ................. | C23C 16/4412 |
| | | | | 417/423.5 |
| 2006/0153696 A1 * | 7/2006 | Ransom | ................ | F01C 21/102 |
| | | | | 417/228 |
| 2006/0162438 A1 * | 7/2006 | Schofield | ................ | F04B 51/00 |
| | | | | 73/168 |
| 2006/0269424 A1 * | 11/2006 | North | .................... | F04B 39/062 |
| | | | | 417/228 |
| 2009/0047142 A1 * | 2/2009 | Hozumi | .................. | F04C 18/16 |
| | | | | 417/244 |
| 2009/0120406 A1 * | 5/2009 | Lindsey | .................... | F03C 2/00 |
| | | | | 123/203 |
| 2010/0239448 A1 * | 9/2010 | Okoroafor | ............ | F04C 18/123 |
| | | | | 418/104 |
| 2014/0205482 A1 * | 7/2014 | Crochet | .................. | F04C 25/02 |
| | | | | 418/5 |
| 2015/0111388 A1 * | 4/2015 | Takahashi | ......... | H01L 21/67017 |
| | | | | 438/706 |

FOREIGN PATENT DOCUMENTS

| | | |
|---|---|---|
| JP | H04330388 A | 11/1992 |
| JP | 2000087852 A | 3/2000 |
| JP | 2001189273 A | 7/2001 |
| JP | 2004200364 A | 7/2004 |
| JP | 2004293466 A | 10/2004 |
| JP | 2007262906 A | 10/2007 |
| KR | 101420348 B1 | 7/2014 |
| WO | 2013144581 A1 | 10/2013 |

OTHER PUBLICATIONS

PCT International Search Report dated Oct. 6, 2015 for corresponding PCT Application No. PCT/JP2015/069429.
PCT International Written Opinion dated Oct. 6, 2015 for corresponding PCT Application No. PCT/JP2015/069429.
European Communication dated May 13, 2020 for corresponding European Application No. EP15827048.8.

* cited by examiner

DRY PUMP AND EXHAUST GAS TREATMENT METHOD

CROSS-REFERENCE TO RELATED APPLICATION

This Application is a Section 371 National Stage Application of International Application No. PCT/JP2015/069429, filed Jul. 6, 2015, which is incorporated by reference in its entirety and published as WO 2016/017376 A1 on Feb. 4, 2016 and which claims priority of Japanese Application No. 2014-157053, filed Jul. 31, 2014.

BACKGROUND OF THE INVENTION

1. Field of the Invention

The present invention relates to a dry pump and an exhaust gas treatment method.

2. Description of the Related Art

In a semiconductor manufacturing treatment process, for example, dry etching treatment or chemical vapor deposition (CVD) in which a semiconductor, an insulator, a metal film, or the like is deposited on a semiconductor wafer in order to form a film through chemical vapor reaction, are performed. In a process chamber, various gases such as silane ($SiH_4$) gas are used. The used gas exhausted from the process chamber is sucked by a dry pump or the like, further introduced into a detoxification device via a gas exhaust pipe, and subjected to detoxification treatment in the detoxification device.

In such a semiconductor manufacturing treatment process, when the foregoing used gas is subjected to cooling or the like, the used gas is solidified into a film or powder and adhere to the insides of an exhaust pipe other than that of the process chamber, the dry pump, and the detoxification device, and result in a deposit. The deposit clogs the pipe, resulting in the need of frequent maintenance.

For the maintenance, in a conventional semiconductor manufacturing treatment process, upon each end of process treatment, a cleaning gas of chlorine trifluoride ($ClF_3$), nitrogen trifluoride ($NF_3$), or hydrogen chloride (HCl), or the like is periodically introduced into the process chamber in accordance with the type of an adhering product. The introduced cleaning gas is led to each of the spots where semiconductor wafers are deposited to resolve and exhaust an adhering material and thus clean a reaction chamber, an exhaust pipe, a dry pump, and a detoxification device in a semiconductor treatment apparatus (see, e.g., Japanese Patent No. 3456933).

In general, as such a used gas and a cleaning gas are heated to a higher temperature of not less than 100° C., the function of resolving and exhausting the adhering material can more efficiently be performed.

Accordingly, the used gas and the cleaning gas (hereinafter such gases are generally referred to as "used gas") flowing from the process chamber through the dry pump toward the detoxification device several meters away from the dry pump are preferably held at a high temperature of not less than 100° C. when introduced into the detoxification device.

In view of this, a method has also been proposed in which, between a dry pump and a detoxification device, a diluent gas heated to about 300° C. is added to the used gas exhausted from the dry pump to be mixed with the used gas. The used gas is thus heated to 150° C. to 200° C. and introduced into the detoxification device (see, e.g., Japanese Patent Application Publication No. H4-330388).

The invention described in Japanese Patent Application Publication No. H4-330388 uses an electrically heated wire as a heat source for heating the diluent gas.

The discussion above is merely provided for general background information and is not intended to be used as an aid in determining the scope of the claimed subject matter. The claimed subject matter is not limited to implementations that solve any or all disadvantages noted in the background.

SUMMARY OF THE INVENTION

As described above, conventionally, an electrically heated wire has been used as a heat source for heating a diluent gas. As a result, a problem arises in that a large amount of electric power is consumed to heat the electrically heated wire.

The present invention has been achieved in view of such a conventional problem. An object of the present invention is to provide a dry pump and an exhaust gas treatment method which can improve an effect of inhibiting a reaction product from adhering to the inside of a gas outlet port of the dry pump, a gas exhaust pipe, or the like and can also improve an energy saving effect.

The present invention has been proposed to attain the foregoing object. The invention in accordance with a first aspect is a dry pump which sucks in a gas exhausted from a process chamber, wherein a diluent gas heated using a heat generated from the dry pump is introduced into either a gas outlet port of the dry pump or a gas exhaust pipe connected to the gas outlet port.

With the configuration, it is possible to introduce the diluent gas heated using the heat generated from the dry pump into either the gas outlet port of the dry pump or the gas exhaust pipe connected to the gas outlet port, mix the diluent gas with the gas from the process chamber, and heat and dilute the gas from the process chamber. As a result, when the gas from the process chamber and the diluent gas are introduced into a detoxification device and subjected to detoxification treatment, each of the gases is heated. This can prevent a reaction product such as a film or powder included in the gases from being solidified in the detoxification device or the gas exhaust pipe to adhere to the inside thereof, and also from being deposited thereon to clog the pipe. In addition, since such gases are heated using the heat generated from the dry pump, instead of using an electrically heated wire as in a conventional device, it is possible to eliminate power consumption and contribute to energy saving.

The invention in accordance with a second aspect is the dry pump in accordance with the first aspect, wherein, by introducing the diluent gas, a gas in either the gas outlet port or the gas exhaust pipe is heated to a temperature of not less than a predetermined value.

In the configuration, the gas in either the gas outlet port or the gas exhaust pipe is heated to a temperature which prevents a reaction product such as a film or powder from being solidified in, e.g., a detoxification device and adhering to the inside thereof. Thus, it is possible to prevent a reaction product such as a film or powder included in each of the gas from the process chamber and the diluent gas from being solidified and adhering to the inside of the detoxification device and the gas exhaust pipe.

The invention in accordance with a third aspect is the dry pump in accordance with the first or second aspect, wherein the heating means includes a heat exchanger which is disposed on with being in firm contact with an outer surface of a casing of the dry pump so as to perform heat exchange with the dry pump.

In the configuration, the heat exchanger is disposed on with being in firm contact with the outer surface of the casing of the dry pump so as to efficiently acquire the heat generated from the dry pump and heat the diluent gas. The heated diluent gas is introduced into the gas exhaust pipe to allow a gas mixture of the gas from the process chamber and the diluent gas to be easily heated to a temperature of not less than the predetermined value.

The invention in accordance with a fourth aspect is the dry pump in accordance with the first, second, or third aspect, wherein the heat exchanger includes a pipe having a rectangular cross-sectional shape and disposed so as to be tightly embedded in a groove having a rectangular cross-sectional shape.

In the configuration, the pipe through which the diluent gas passes is disposed so as to be tightly embedded in the groove having the rectangular cross-sectional shape. This allows the heat exchanger to efficiently perform heat exchange between the dry pump and the diluent gas.

The invention in accordance with a fifth aspect is the dry pump in accordance with the first, second, third, or fourth aspect, wherein the diluent gas is heated by a pipe disposed in a casing of the dry pump.

The configuration allows the heat exchange with the dry pump to be efficiently performed through the pipe disposed in the casing of the dry pump and allows the diluent gas passing through the pipe to be easily heated to a temperature of not less than the predetermined value.

The invention in accordance with a sixth aspect is the dry pump in accordance with the first, second, or fifth aspect, wherein the diluent gas is introduced as a sealing gas into the casing of the dry pump.

In the configuration, the diluent gas serves also as the sealing gas. This allows a structure to be simplified and contributes to a cost reduction.

The invention in accordance with a seventh aspect is the dry pump in accordance with the sixth aspect, wherein at least a part of the sealing gas is exhausted through the gas outlet port of the dry pump.

In the configuration, the sealing gas is exhausted through the gas outlet port of the dry pump. This allows the structure to be simplified.

The invention in accordance with an eighth aspect is the dry pump in accordance with the sixth aspect, wherein the sealing gas is introduced into a pump chamber of the dry pump.

The configuration allows the pump chamber where a pressure increases to be easily sealed using the sealing gas.

The invention in accordance with a ninth aspect is the dry pump in accordance with the eighth aspect, wherein an outlet port through which the sealing gas is exhausted to the outside of the dry pump is provided in an upstream vicinity of an inlet port through which the sealing gas is introduced into the pump chamber of the dry pump.

In the configuration, the outlet port through which the sealing gas is exhausted to the outside of the dry pump is provided in the upstream vicinity of the inlet port through which the sealing gas is introduced into the dry pump. This allows the structure to be simplified.

The invention in accordance with a tenth aspect is the dry pump in accordance with the ninth aspect, wherein the sealing gas is introduced into a final chamber of the pump chamber of the dry pump.

The configuration allows the final pump chamber where a pressure is highest to be easily sealed using the sealing gas.

The invention in accordance with an eleventh aspect is the dry pump in accordance with the first, second, third, fourth, fifth, sixth, seventh, eighth, ninth, or tenth aspect, wherein the diluent gas is a nitrogen ($N_2$) gas.

The configuration allows the gas from the process chamber and the diluent gas to be easily heated to a temperature of not less than the predetermined value using the nitrogen ($N_2$) gas.

The invention in accordance with a twelfth aspect is the dry pump in accordance with the first, second, third, fourth, fifth, seventh, eighth, ninth, tenth, or eleventh aspect, wherein the introduction of the diluent gas is controlled by a control device.

The configuration allows the diluent gas to be automatically introduced in an optimum state under the control of the control device.

The invention in accordance with a thirteenth aspect is an exhaust gas treatment method including the step of introducing, in a dry pump which sucks in a gas exhausted from a process chamber, a diluent gas heated using a heat generated from the dry pump into the gas from the process chamber to dilute the gas from the process chamber.

The method allows the diluent gas heated using the heat generated from the dry pump to be mixed with the gas from the process chamber to allow the gas from the process chamber to be heated and diluted. As a result, when the gas from the process chamber and the diluent gas are introduced into a detoxification device and subjected to detoxification treatment, each of the gases is heated. This can prevent a reaction product such as a film or powder included in the gases from being solidified in the detoxification device or the gas exhaust pipe to adhere to the inside thereof, and also from being deposited thereon to clog the pipe. In addition, since the gases are heated using the heat generated from the dry pump, instead of using an electrically heated wire as in a conventional device, it is possible to eliminate power consumption and contribute to energy saving.

The invention in accordance with a fourteenth aspect is the exhaust gas treatment method in accordance with the thirteenth aspect, wherein, by introducing the diluent gas, the gas from the process chamber is heated to a temperature of not less than a predetermined value.

In accordance with the method, when the gas from the process chamber and the diluent gas are introduced into a detoxification device and subjected to detoxification treatment, each of the gases is heated. This can prevent a reaction product such as a film or powder included in the gases from being solidified in the detoxification device or the gas exhaust pipe to adhere to the inside thereof, and also from being deposited thereon to clog the pipe.

The present invention can provide a dry pump and an exhaust gas treatment method which can improve the effect of inhibiting a reaction product from adhering to the inside of a gas outlet port (including also a portion extending from an outlet of a pump chamber to the outlet port) of the dry pump or a gas exhaust pipe and can also improve an energy saving effect.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

DESCRIPTION OF THE PREFERRED EMBODIMENTS

An object of the present invention is to provide a dry pump which can improve an effect of inhibiting a reaction product from adhering to the inside of a gas outlet port of the dry pump or a gas exhaust pipe and can also improve an energy saving effect. To attain the object, the present invention is achieved by introducing, in the dry pump which sucks in a gas exhausted from a process chamber, a diluent gas heated using a heat generated from the dry pump into either the gas outlet port of the dry pump or the gas exhaust pipe connected to the gas outlet port.

Another object of the present invention is to provide an exhaust gas treatment method which can improve an effect of inhibiting a reaction product from adhering to the inside of a gas outlet port of a dry pump or a gas exhaust pipe and can also improve an energy saving effect. To attain the object, the present invention is achieved by introducing, in the dry pump which sucks in a gas exhausted from a process chamber, a diluent gas heated using a heat generated from the dry pump into the gas from the process chamber that has been exhausted from the dry pump to dilute the gas from the process chamber.

Using FIGS. 1 to 4, the following will describe preferred examples of an exhaust gas treatment apparatus in a semiconductor manufacturing treatment process according to an embodiment of the present invention in detail.

Figure 1:
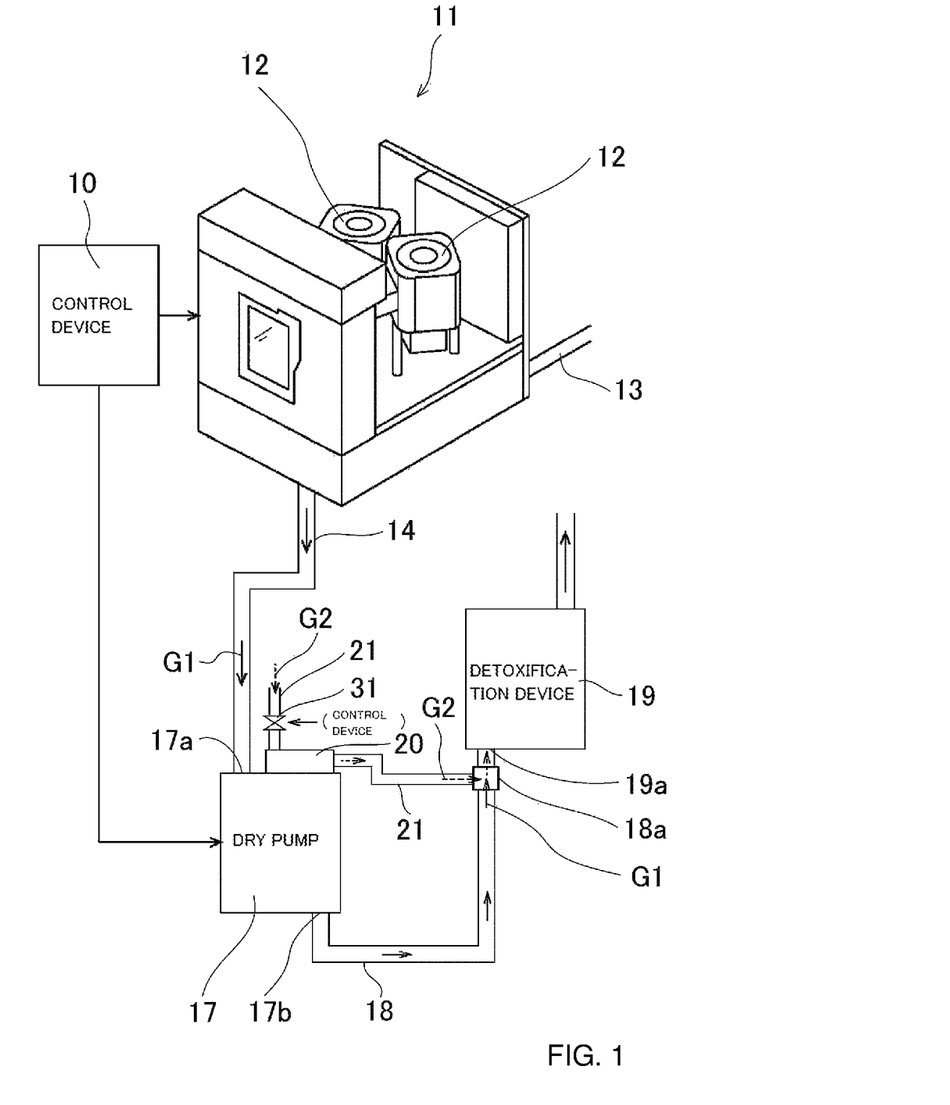
FIG. 1 is a block diagram showing a schematic overall configuration of an exhaust gas treatment apparatus in a semiconductor manufacturing treatment process according to an embodiment of the present invention.

FIG. 1 is a block diagram showing a schematic overall configuration of the exhaust gas treatment apparatus according to the present invention. Using FIG. 1, the following will describe the outline of the overall configuration of the exhaust gas treatment apparatus. The exhaust gas treatment apparatus is controlled in accordance with a procedure determined in advance by a program in a control device 10. In a process chamber 11, semiconductor wafers 12 are contained and each of a process gas for process treatment and a cleaning gas for cleaning treatment is supplied into the process chamber 11 through a gas supply pipe 13. To the process chamber 11, a dry pump 17 is connected via a gas exhaust pipe 14. The process chamber 11 is adapted to be depressurized to a high vacuum by driving the dry pump 17.

That is, a process gas such as, e.g., silane ($SiH_4$) and a cleaning gas such as chlorine trifluoride ($ClF_3$), nitrogen trifluoride ($NF_3$), or hydrogen chloride (HCl) which have been used for treatment in the foregoing process chamber 11 (such a process gas and a cleaning gas will be hereinafter generally referred to as "used gas G1") pass through the gas exhaust pipe 14 to be introduced into the downstream dry pump 17. The dry pump 17 sucks in the used gas G1 from the process chamber 11 through a gas inlet port 17a and gradually pressurizes the used gas G1 in, e.g., six stages therein. The used gas G1 pressurized to a pressure in the vicinity of an atmospheric pressure in the dry pump 17 is exhausted from a gas outlet port 17b into a gas exhaust pipe 18 and transmitted from the gas exhaust pipe 18 to a detoxification device 19. After detoxified in the detoxification device 19, the used gas G1 is exhausted into atmospheric air. Accordingly, the gas exhaust pipe 18 has one end connected to the gas outlet port 17b of the dry pump 17 and the other end connected to a gas inlet port 19a of the detoxification device 19.

To the foregoing dry pump 17, a heat exchanger 20 as heating means is attached. Into the heat exchanger 20, a diluent gas G2 is caused to flow through a diluent gas pipe 21. The diluent gas G2 heated by the heat exchanger 20 is introduced from a diluent gas feed port 18a provided in the middle of the gas exhaust pipe 18 into the gas exhaust pipe 18, mixed with the used gas G1 from the dry pump 17, and introduced into the detoxification device 19. Note that, in the present example, the diluent gas G2 is, e.g., a nitrogen ($N_2$) gas. The position where the diluent gas feed port 18a is to be provided is arbitrarily set between the gas outlet port 17b and the gas inlet port 19a of the detoxification device 19. The diluent gas feed port 18a allows the foregoing diluent gas G2 to flow from any set position into the gas exhaust pipe 18.

Figure 2:
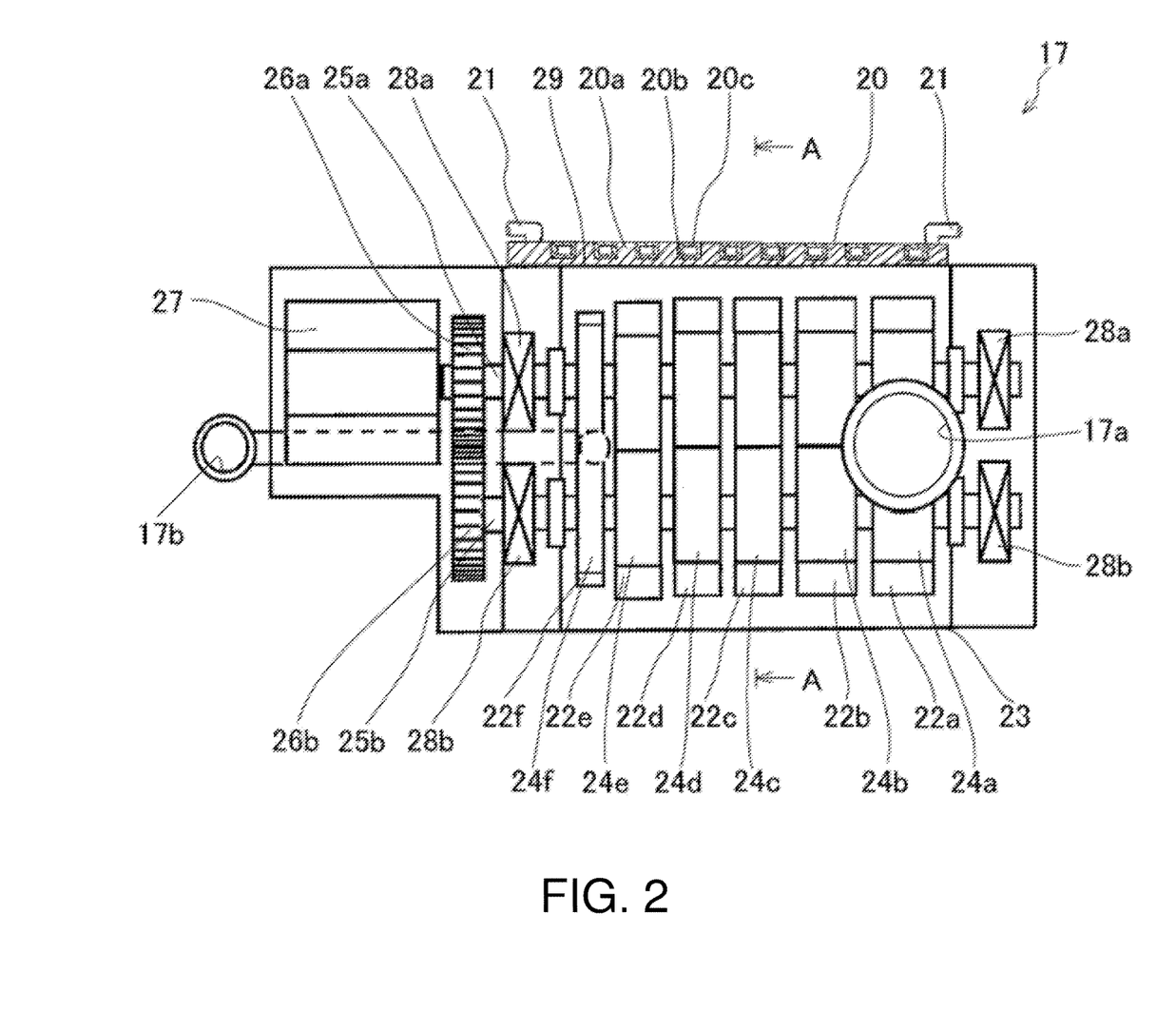
FIG. 2 is a schematic side cross-sectional view related to a first example of the dry pump shown in FIG. 1 and schematically showing an inner structure thereof.

FIG. 2 is a schematic side cross-sectional view schematically showing an inner structure of the dry pump 17 in a first example of the present embodiment. The dry pump 17 shown in FIG. 2 includes a pump casing 23 having a plurality of (six in the present example) pump chambers 22a, 22b, 22c, 22d, 22e, and 22f, rotors 24a, 24b, 24c, 24d, 24e, and 24f disposed in the respective pump chambers 22a to 22f, a pair of rotation shafts 25a and 25b each having the rotors 24a to 24f integrally fixed thereto to integrally rotate the rotors 24a to 24f, a pair of gears 26a and 26b for rotating the pair of rotation shafts 25a and 25b in synchronization, a motor 27 as a rotation driving mechanism for rotating the rotation shafts 25a and 25b via the pair of gears 26a and 26b, and bearing pairs 28a and 28b which support the rotation shafts 25a and 25b relative to a pump casing 23.

Figure 3:
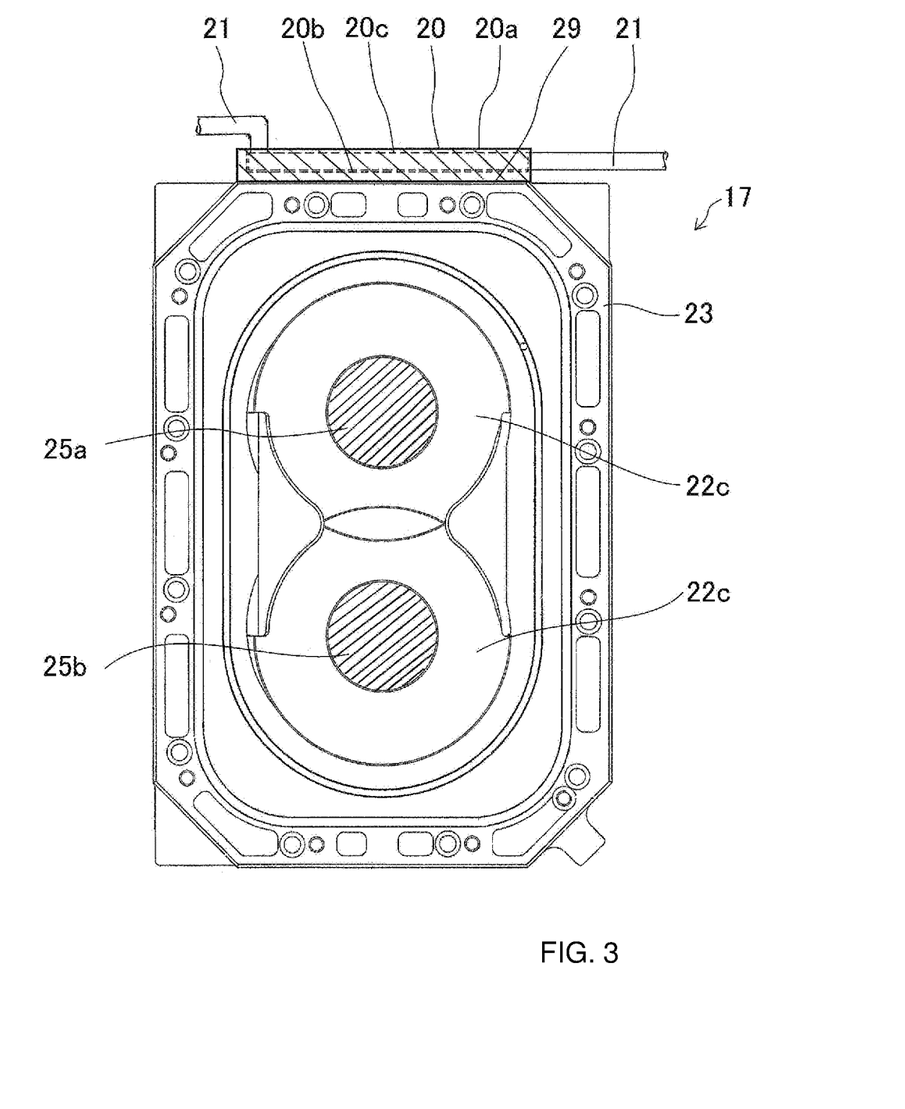
FIG. 3 is a cross-sectional view along the line A-A in FIG. 3.

The foregoing pump casing 23 is formed by successively arranging a plurality of stators 23a in multiple layers in an axial direction in consideration of assemblability, though not shown. The foregoing pump casing 23 is also formed such that, as shown in FIG. 3, a cross section thereof perpendicular to the rotation shafts 25a and 25b has a generally rectangular shape. On an outer peripheral surface 29 of the pump casing 23, the foregoing heat exchanger 20 for performing heat exchange with the dry pump 17 is disposed.

As shown in FIGS. 2 and 3, the foregoing heat exchanger 20 includes a heat exchanger casing 20a disposed on with being in firm contact with the outer peripheral surface 29 of the pump casing 23 and formed of a material (e.g., an aluminum material) having an excellent heat conductivity and a gas pipe 20c formed of a material (e.g., a copper material) similarly having an excellent heat conductivity. The heat exchanger casing 20a has a guide groove 20b which is opened in an outer side surface thereof to have a U-shaped cross-sectional shape and bent in a zigzag pattern. In the guide groove 20b bent in the zigzag pattern, the foregoing gas pipe 20c is disposed to be also bent in the zigzag pattern similarly to the guide groove 20b.

Figure 4A:
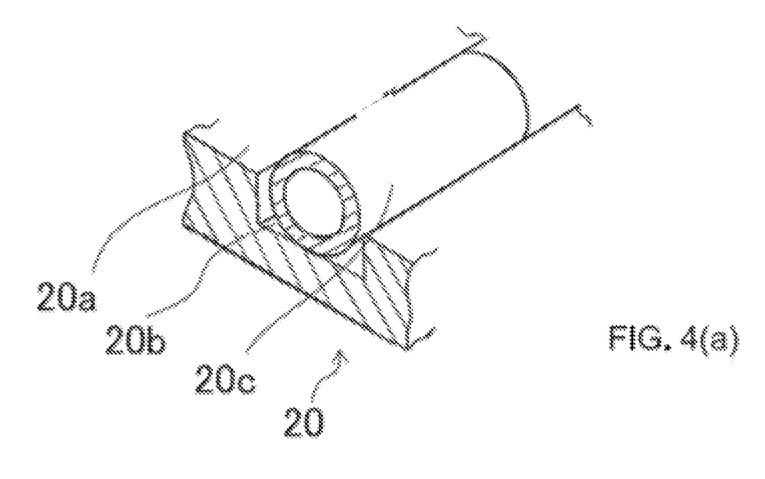
FIGS. 4(a) and 4(b) are a set of views illustrating a structure of a pipe in the dry pump.
Figure 4B:
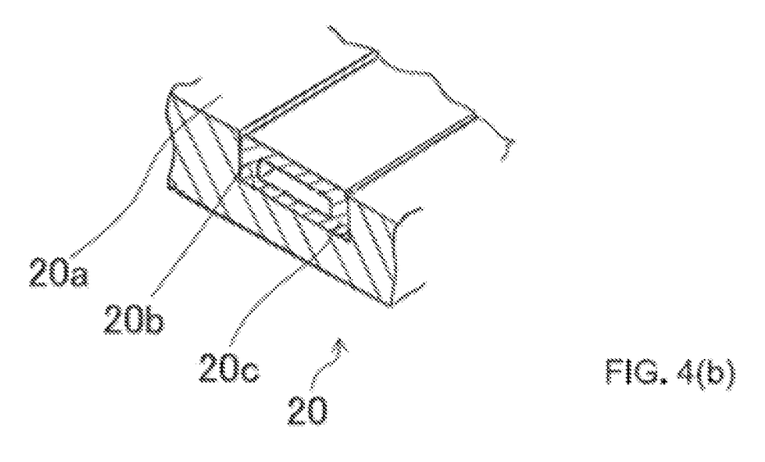

The gas pipe 20c originally has a circular cross-sectional shape. The gas pipe 20c having the circular cross-sectional is disposed in the guide groove 20b, as shown in, e.g., FIG. 4A, and pressed from the outside thereof to be deformed. Thus, as shown in FIGS. 4B and 2, the gas pipe 20c is brought into firm contact with three inner surfaces of the guide groove 20b to be formed into the gas pipe 20c having a rectangular cross section. As a result, the heat exchanger casing 20a and the gas pipe 20c are integrated with each other in the guide groove 20b to allow heat exchange to be efficiently performed between the heat exchanger casing 20a and the gas pipe 20c.

In the heat exchanger 20 thus formed, when the foregoing diluent gas pipe 21 is connected to each of the inlet and outlet of the gas pipe 20c and the diluent gas G2 is caused to flow in the diluent gas pipe 21, the diluent gas G2 passes through the diluent gas pipe 21 and the heat exchanger 20 to enter the gas exhaust pipe 18 from a point in the middle of the gas exhaust pipe 18, i.e., from the diluent gas feed port 18a between the dry pump 17 and the detoxification device 19. Thus, the diluent gas G2 can be mixed with the used gas G1 from the dry pump 17 and introduced into the detoxification device 19. Note that, to a point in the middle of the diluent gas pipe 21, an open/close valve 31 is attached and the open/close control of the open/close valve 31 is performed under the control of the control device 10. That is, when the open/close valve 31 is open, the diluent gas G2 heated by the heat exchanger 20 is allowed to enter the gas exhaust pipe 18 from the diluent gas feed port 18a.

Since the heat exchanger 20 has the heat exchanger casing 20a disposed on with being in firm contact with the pump casing 23, during the operation of the dry pump 17, the heat exchanger casing 20a and the gas pipe 20c are heated to generally the same temperatures (150° C. to 200° C. in the present example) as the pump casing 23. Consequently, the diluent gas G2 transmitted to the heat exchanger 20 through the diluent gas pipe 21 is heated by the heat from the gas pipe 20c to a temperature in the vicinity of 150° C. to 200° C., while passing through the gas pipe 20c of the heat exchanger 20. The heated diluent gas G2 is caused to flow from the diluent gas feed port 18a provided in the middle of the gas exhaust pipe 18 into the gas exhaust pipe 18 and mixed with the used gas G1 from the dry pump 17. Thus, the used gas G1 can be heated to a temperature in the vicinity of 150° C. to 200° C. and fed into the detoxification device 19. Therefore, to allow the heated gas mixture (G1 and G2) to be introduced into the detoxification device 19 while retaining a high temperature, the diluent gas pipe 21 and the gas exhaust pipe 18 are preferably connected at a position immediately before and as close as possible to the detoxification device 19.

Next, the function of the exhaust gas treatment apparatus thus configured will be described. First, when the dry pump 17 is activated under the control of the control device 10, the motor 27 is also driven to rotate the rotation shaft 25a. At this time, the rotation shaft 25b arranged in parallel with the rotation shaft 25a is rotated in synchronization by engagement of the gears 26a and 26b with each other. The rotation shaft 25b rotates in a direction opposite to the direction of rotation of the rotation shaft 25a.

By the rotation of the rotation shafts 25a and 25b, the rotors 24a to 24f integrally fixed to the rotation shaft 25a and the rotors 24a to 24f integrally fixed to the rotation shaft 25b rotate in opposite directions in the respective pump chambers 22a to 22f. Note that the rotors 24a to 24f attached to the rotation shaft 25a and the rotors 24a to 24f attached to the rotation shaft 25b are cocoon-shaped root rotors which rotate in synchronization, while maintaining 90° phase differences and minute gaps therebetween in non-contact relation.

As a result, from the gas inlet port 17a communicating with a target space to be evacuated, the used gas G1 is sucked into the first stage pump chamber 22a. Then, the used gas G1 is successively sucked from the first stage pump chamber 22a into the second stage pump chamber 22b, from the second stage pump chamber 22b into the third stage pump chamber 22c, from the third stage pump chamber 22c into the fourth stage pump chamber 22d, and from the fourth stage pump chamber 22d into the fifth stage pump chamber 22e. Finally, the used gas G1 is exhausted from the dry pump 17 via the gas exhaust pipe 18 communicating with the gas outlet port 17b of the sixth stage pump chamber 22f to bring the target space to be evacuated into a vacuum state.

At this time, the used gas G1 is exhausted, while being compressed in each of the pump chambers 22a, 22b, 22c, 22d, 22e, and 22f. As a result, the temperature of the used gas G1 increases to also increase the temperature of the pump casing 23. Note that, among the pump chambers 22a, 22b, 22c, 22d, 22e, 22f, the sixth stage pump chamber 22f is highest in the temperature of the used gas G1 at an outlet side. The sixth stage pump chamber 22f has a large pressure difference between the used gas G1 at an inlet side and the used gas G1 at the outlet side. At the outlet side of the sixth stage pump chamber 22f, the used gas G1 is heated to a relatively high temperature in a range of, e.g., about 150° C. to 200° C.

The used gas G1 exhausted from the sixth stage pump chamber 22f flows toward the detoxification device 19 several meters away through the gas exhaust pipe 18. Note that, when mixed with the diluent gas G2 at a temperature lower than that of the heated used gas G1 mentioned above, the used gas G1 may be cooled. However, in the case of the structure in the present example, the diluent gas G2 heated to a temperature in the vicinity of 150° C. to 200° C. while passing through the heat exchanger 20 as the heating means is introduced into the gas outlet port 17b or into the gas exhaust pipe 18 from the diluent gas feed port 18a provided in the middle of the gas exhaust pipe 18. The diluent gas G2 is mixed with the used gas G1 from the dry pump 17 to heat the used gas G1 again to a high temperature in the vicinity of 150° C. to 200° C. and feed the heated used gas G1 into the detoxification device 19. As a result, the used gas G1 which is about to be condensed is heated again to a high temperature to be vaporized and introduced together with the diluent gas G2 into the detoxification device 19.

Accordingly, with this configuration, it is possible to eliminate a reaction product deposited in the gas outlet port 17b or in the gas exhaust pipe 18 and the detoxification device 19 and prevent the pipe from being clogged. In addition, the used gas G1 and the diluent gas G2 that have been introduced into the detoxification device 19 are detoxified in the detoxification device 19 and then smoothly exhausted therefrom into atmospheric air. Moreover, the heat exchanger 20 as the heating means uses the heat generated from the dry pump 17 as a heat source and does not use an electrically heated wire as used in a conventional device. This can eliminate power consumption and contribute to energy saving.

Figure 5:
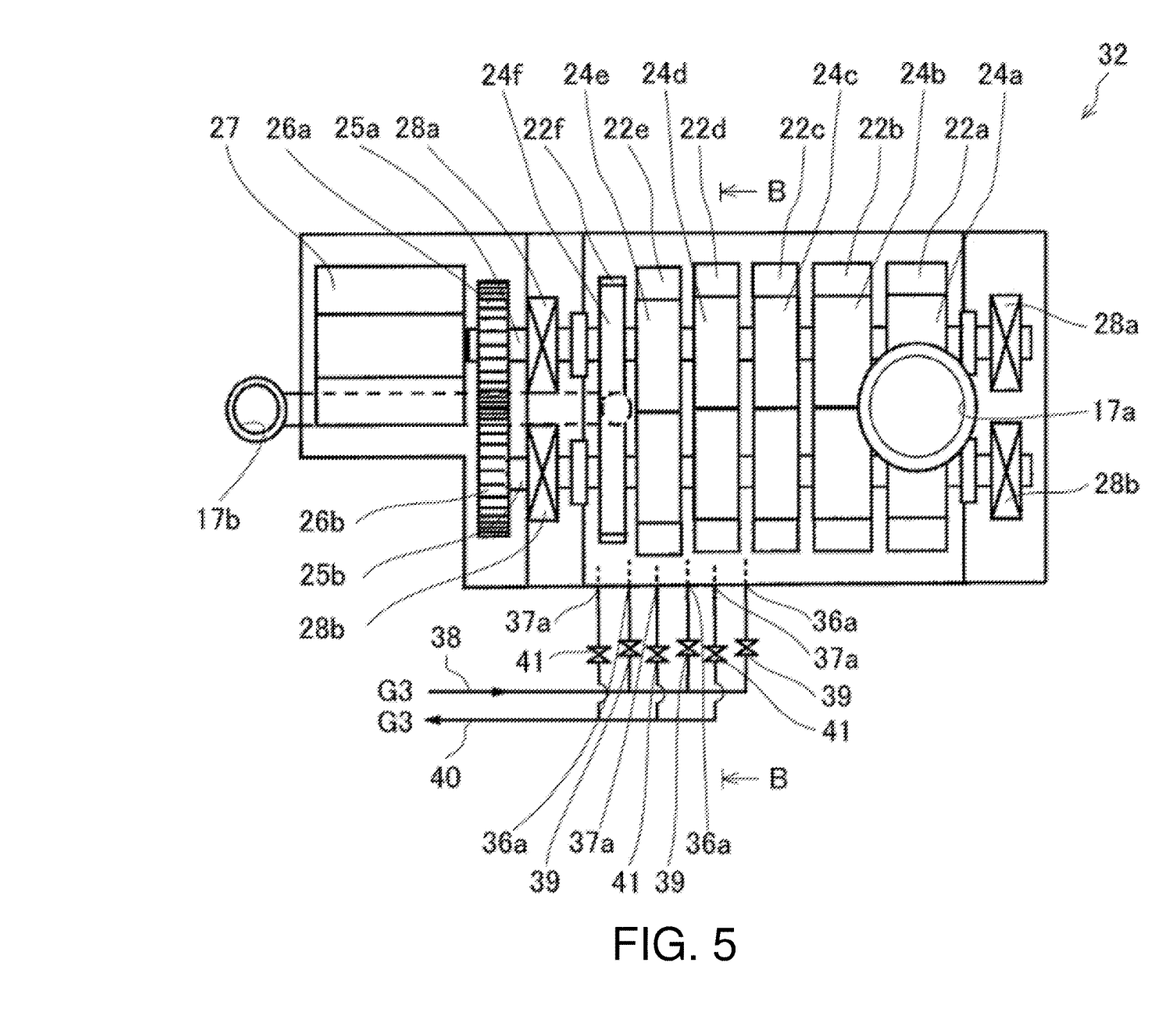
FIG. 5 is a schematic side cross-sectional view related to a second example of the dry pump shown in FIG. 1 and schematically showing an inner structure thereof.
Figure 6:
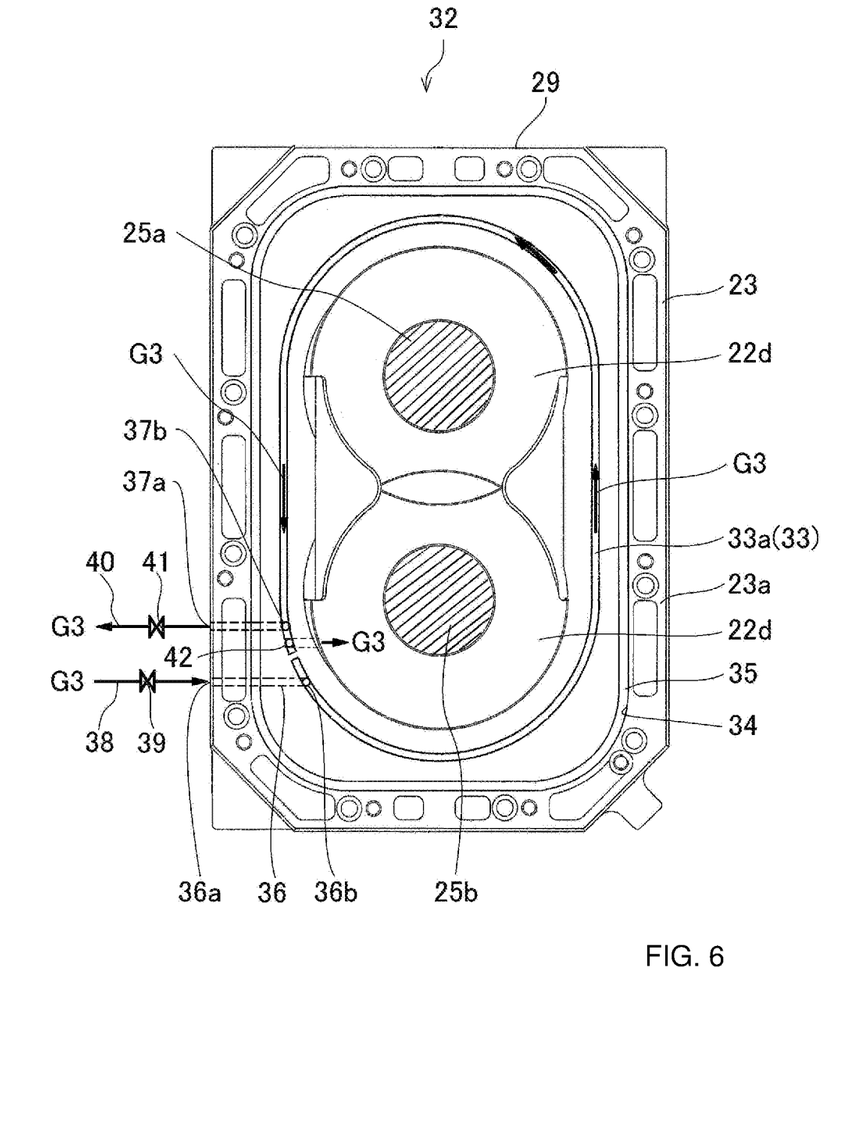
FIG. 6 is a cross-sectional view along the line B-B in FIG. 5.

FIGS. 5 and 6 show a second example of the dry pump. FIG. 5 is a schematic side cross-sectional view schematically showing an inner structure of a dry pump 32. FIG. 6 is a cross-sectional view along the line B-B in FIG. 5. In the first example shown in FIGS. 2 to 4, the heat exchanger 20 is attached to the outside of the pump casing 23 and the diluent gas G2 is caused to flow in the heat exchanger 20. By contrast, the dry pump 32 in the second example is configured such that a sealing gas G3 is caused to flow in a sealing gas flow path 33 formed of sealing gas grooves 33a provided in the pump casing 23 such that the sealing gas G3 is heated with the heat generated in the pump casing 23 to be used as a diluent gas. Accordingly, in the following description, the same components as those of the dry pump 17 in the first example shown in FIGS. 2 to 4 are designated by the same reference numerals and a description thereof is omitted. A description will be given only of a portion with a different structure.

In FIGS. 5 and 6, in respective facing surfaces of the plurality of stators 23a arranged in multiple layers in an axial direction to form the pump casing 23, the sealing gas grooves 33a are formed so as to externally surround the respective pump chambers 22d to 22f. During the formation of the pump casing 23, when the individual stators 23a are arranged in multiple layers and assembled, in respective portions forming the individual pump chambers 22d to 22f, the sealing gas grooves 33a face each other to form the sealing gas flow path 33 in which the sealing gas G3 flows. In the case described in the present example, the respective sealing gas grooves 33a are formed in both side surfaces of each of the stators 23a. However, it may also be possible that the sealing gas groove 33a is formed only in one side surface of each of the stators 23a. Note that, during the assembly of the pump casing 23, between the individual pump chambers 22a to 22f and the stators 23a, O-rings 35 are disposed tightly in O-ring grooves 34 so as to externally surround the respective pump chambers 22d to 22f and maintain hermetic sealing of the pump chambers 22a to 22f, as shown in FIG. 6.

Since the O-rings 35 are corroded by the foregoing used gas G1, in the dry pump 32 in the present example, a $N_2$ gas as inert gas is introduced into the sealing gas flow path 33 to prevent the corrosion. The respective pressures in the first to sixth stage pump chambers 22a to 22f are progressively higher in order of increasing "stage" number. Accordingly, in the dry pump 32 in the present example, the $N_2$ gas as the sealing gas G3 is caused to flow (introduced) into the each of the fourth, fifth, and sixth stage pump chambers 22d to 22f having the higher "stage" numbers. This is intended to prevent sealing performance from deteriorating as the O-rings 35 are more likely to be corroded due to the compression/condensation of the corrosive used gas G1 in the pump chambers 22d to 22f having the progressively higher pressures and to contribute to the sealing performance in association with the O-rings 35. Note that, to simplify the structure of the dry pump 32, the pump chamber into which the sealing gas G3 is caused to flow may also be only a final pump chamber (sixth stage pump chamber) 22f having the highest pressure.

Accordingly, in the dry pump 32 in the second example, the sealing gas groove 33a in each of the stators 23a forming the fourth, fifth, and sixth stage pump chambers 22d to 22f is provided with a sealing gas inlet port 36b of a sealing gas feed path 36 and with a sealing gas outlet port 37b of a sealing gas exhaust path 37. The sealing gas feed path 36 has a sealing-gas-feed-pipe connection port 36a provided in an outer surface (outer surface 29 of the pump casing 23) of the stator 23a. The sealing gas exhaust path 37 has a sealing-gas-exhaust-pipe connection port 37a similarly provided in the outer surface of the stator 23a. To each of the sealing-gas-feed-pipe connection ports 36a, a sealing gas feed pipe 38 into which the sealing gas G3 is supplied is connected via a control valve 39. To each of the sealing-gas-exhaust-pipe connection ports 37a, a sealing gas exhaust pipe 40 into which the sealing gas G3 is exhausted is connected via a control valve 41. The sealing gas exhaust pipe 40 is also connected to the gas exhaust pipe 18 via the diluent gas feed port 18a. Note that, as the control valves 39 and 41, control valves each capable of controlling, e.g., a gas flow rate may be used appropriately.

In the dry pump 32 thus configured, when the sealing gas G3 is fed from the sealing gas feed pipe 38, the sealing gas G3 passes through the sealing gas feed paths 36 to enter the sealing gas flow path 33 formed in the pump casing 23. After flowing in the sealing gas flow path 33, the sealing gas G3 passes from the sealing gas outlet ports 37b through the sealing gas exhaust paths 37 to be exhausted into the sealing gas exhaust pipe 40. The sealing gas G3 is then transmitted into the gas exhaust pipe 18 via the gas outlet port 17b or the diluent gas feed port 18a to be mixed with the used gas G1.

Note that the supply and exhaust of the sealing gas G3 to each of the pump chambers 22d to 22f can be adjusted individually using the control valve 39 or 41. That is, when a large amount of the sealing gas G3 is caused to flow at a time into the pump chambers 22d to 22f, the exhaust performance of the dry pump 32 may be affected thereby. Accordingly, the sealing gas G3 is not introduced into all the pump chambers 22d to 22f at a time. The flow of the sealing gas G3 is adjusted using the control valve 39 or 41 such that, depending on the situation, the sealing gas G3 is caused to flow at a flow rate which does not affect the exhaust performance of the dry pump 32, into each of the pump chambers 22d to 22f. In general, the flow rate of a diluent gas required for dilution in the gas outlet port 17b or the gas exhaust pipe 18 is higher than the flow rate of a gas required for sealing using an O-ring. This configuration allows a gas to flow in the sealing gas flow path 33 at a flow rate necessary and sufficient for dilution in the gas outlet port 17b or the gas exhaust pipe 18, without affecting the exhaust performance of the dry pump 32.

As a result, when the sealing gas flow path 33 of the dry pump 32 is used, the sealing gas G3 passing through the pump casing 23 is heated to a relatively high temperature of, e.g., about 150° C. to 200° C. by the pump casing 23 having an increased temperature. The sealing gas G3 is then transmitted into the gas exhaust pipe 18 and mixed with the used gas G1. Thus, the sealing gas can be fed into the detoxification device 19 in the same manner as in the first example. Thus, reusing the sealing gas G3 for preventing the corrosion of the respective O-rings 35 in the pump chambers 22d to 22f as the diluent gas, it is possible to eliminate a reaction product deposited in the gas outlet port 17b or in the gas exhaust pipe 18 and the detoxification device 19 and prevent the pipe from being clogged. In addition, the used gas G1 and the diluent gas G2 that have been introduced into the detoxification device 19 are detoxified in the detoxification device 19 and then smoothly exhausted into atmospheric air. Moreover, as the heat source used herein, the heat generated from the dry pump 32 is used, but an electrically heated wire as used in a conventional device is not used. This can eliminate power consumption and contribute to energy saving.

Note that, as shown in FIG. 6, each of the sealing gas outlet ports 37b which exhaust the sealing gas G3 to the outside of the dry pump 32 is preferably disposed in an upstream vicinity of the sealing gas inlet port 42 through which the sealing gas G3 is introduced into each of the pump chambers 22d to 22f. This allows the amount of the sealing gas G3 flowing into each of the pump chambers 22d to 22f to be easily controlled by providing the control valve 41 at the outlet side.

The structure in the first example and the structure in the second example can also be combined with each other as necessary.

In the case disclosed in each of the foregoing examples, only the heat generated from the dry pump 17 or 32 is used as a heat source. However, as necessary, an electrically heated wire may also be used in combination. In that case also, it is possible to significantly reduce power consumption used by the electrically heated wire and contribute to energy saving.

It will be appreciated that, in addition to the foregoing modifications, various modifications can be made in the present invention without departing from the spirit thereof and that the present invention is intended to encompass such modifications.

The present invention is also applicable to an exhaust gas treatment apparatus in addition to a semiconductor manufacturing treatment process.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

What is claimed is:

1. A dry pump which sucks in a gas exhausted from a process chamber, the dry pump comprising:
   a plurality of stators;
   a rotor exhausting the gas while compressing the gas in cooperation with the plurality of stators;
   a diluent gas path formed on at least one of the plurality of stators, the diluent gas path having an inlet and an outlet, the inlet connected to a diluent gas feed connection port located on one stator of the plurality of stators at an exterior of the dry vacuum pump and the outlet connected to a diluent gas exhaust port located on the one stator at the exterior of the dry pump; and
   a control valve positioned between the diluent gas exhaust port at the exterior of the dry pump and at least one of a gas outlet port of the dry pump or a gas exhaust pipe connected to the gas outlet port such that the control valve provides continuous control of a flow rate of diluent gas passing through the outlet of the diluent gas path.

2. The dry pump according to claim 1, wherein, by introducing the diluent gas to the gas outlet port or the gas exhaust pipe, a gas in either the gas outlet port or the gas exhaust pipe is heated to a temperature of not less than a value for preventing a deposition of a reaction product.

3. The dry pump according to claiml, wherein at least a part of the diluent gas is exhausted through the gas outlet port of the dry pump.

4. The dry pump according to claim 1, wherein the outlet of the diluent gas path is provided upstream of an inlet port through which the diluent gas is introduced into the pump chamber of the dry pump.

5. The dry pump according to claim 4, wherein the diluent gas is introduced into a final chamber of the pump chamber of the dry pump.

6. The dry pump according to claim 1, wherein the diluent gas is a nitrogen ($N_2$) gas.

7. The dry pump according to claim 1, wherein the introduction of the diluent gas to the inlet of the diluent gas path is controlled by a control device.

* * * * *